United States Patent [19]

Fontaine et al.

[11] Patent Number: 4,763,327

[45] Date of Patent: Aug. 9, 1988

[54] DISTRIBUTED DIGITAL SIGNAL PROCESS MULTIPLEXER

[75] Inventors: John M. Fontaine, Scottsdale, Ariz.; Patrick W. Dennis, Salt Lake City, Utah

[73] Assignee: Unisys Corporation, Blue Bell, Pa.

[21] Appl. No.: 85,919

[22] Filed: Aug. 17, 1987

[51] Int. Cl.$^4$ .............................................. H04J 3/04
[52] U.S. Cl. ................................. 370/112; 307/243; 328/104
[58] Field of Search ....................... 370/112, 113, 58; 307/243; 328/104

[56] References Cited

U.S. PATENT DOCUMENTS

| | | | |
|---|---|---|---|
| 4,010,385 | 3/1977 | Krol .................................. | 370/112 |
| 4,145,719 | 3/1979 | Hand et al. ........................ | 307/243 |
| 4,390,988 | 6/1983 | Best et al. ......................... | 328/104 |

Primary Examiner—Douglas W. Olms
Assistant Examiner—Frank M. Scutch, III
Attorney, Agent, or Firm—John B. Sowell; L. J. Marhoefer; T. J. Scott

[57] ABSTRACT

An ultra high frequency multiplexer for combining very high frequency data inputs to produce multiplexed data outputs in the Gigahertz range is provided. Typical ECL output data pulses from integrated circuits are employed as inputs to individual gates of a plurality of dual gates GaAs MESFETS. The second gate of the individual GaAs device is provided with an ultra high frequency clock enable pulse that produces a plurality of pulses are ultra high frequency pulse rates. The outputs of the GaAs devices are delayed one from the other and the delayed outputs are recombined in a combining network to provide a combined multiplexed data output at ultra high frequency.

10 Claims, 3 Drawing Sheets

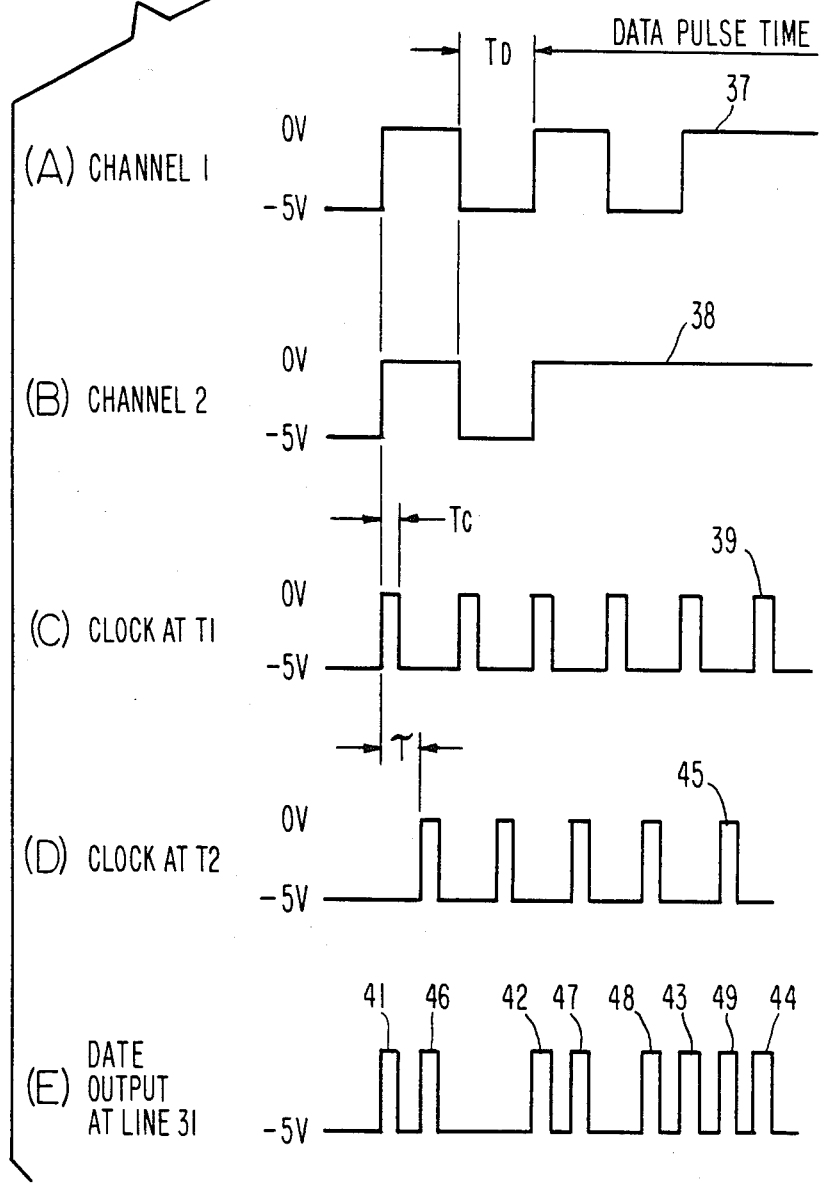

DISTRIBUTED DIGITAL SIGNAL PROCESS MULTIPLEXER

BACKGROUND OF THE INVENTION

1. Field of the Invention

This invention relates to an ultra high frequency multiplexer. More particularly, this invention relates to an ultra high frequency multiplexer having matched impedance at the input and output lines.

2. Description of the Prior Art

In the present state of the art, it is generally known that the highest frequency rate for transmitting data is in the range of 200 to 300 megabits per second using the highest data rate commercially available integrated circuits. Emitter Coupled Logic (ECL) integrated circuits do not change their data state fast enough beyond the very high frequency range (up to 300 megahertz) to be used in ultra high frequency data rate digital equipment. Thus, an ECL multiplexer on an IC chip would not be feasible for ultra high frequency transmission of data.

There are commercially available multiplexers that are made in the form of integrated circuits. However, these commercially available integrated circuits are limited below the range of ultra high frequency and the input and output to these integrated circuits is not matched to standard impedance input and output cable. Another problem which presents itself in ultra high frequency transmission of data, is that the length of the cables attached to the integrated circuits cause phase shift of the data signals which is unacceptable for ultra high frequency transmission of signals.

Heretofore, phase generators and multipliers were known. However, the logic gating and combining of pulses in such devices as phase generators and multipliers were limited to the fastest logic switching time of the family of integrated circuits employed for these devices.

There is a need for an ultra high frequency generator which can be employed to transmit data from one point to another at speeds higher than the logic switching time of commercially available ECL integrated circuit logic.

SUMMARY OF THE INVENTION

It is a principal object of the present invention to provide a multiplexer for generating data rates higher than is possible with ECL integrated circuit logic.

It is another principal object of the present invention to provide a multiplexer for generating output data signals at ultra high frequency data rates for transmission on a microwave carrier.

It is another object of the present invention to provide a multiplexer for producing ultra high frequency data trains having fast rise and fall time and low ringing.

It is yet another object of the present invention to provide a multiplexer for producing ultra high frequency data trains which are impedance matched to the input and output lines.

According to these and other objects of the present invention, there is provided a plurality of dual input GaAs MESFET transistors which are distributed along a transmission line so as to receive clock pulses from taps on the transmission line. The dual input transistors are enabled by the clock pulses. The second gate of each transistor is coupled to an input data channel which is being driven at a data rate below the ultra high frequency level. The output from the plurality of GaAs tansistors are combined in a combining network to provide output data in the ultra high frequency range.

BRIEF DESCRIPTION OF THE DRAWINGS

FIG. 3 is a schematic timing diagram employed to explain the operation of the multiplexer shown in FIGS. 1 and 2.

DESCRIPTION OF THE PREFERRED EMBODIMENT

Figure 1:
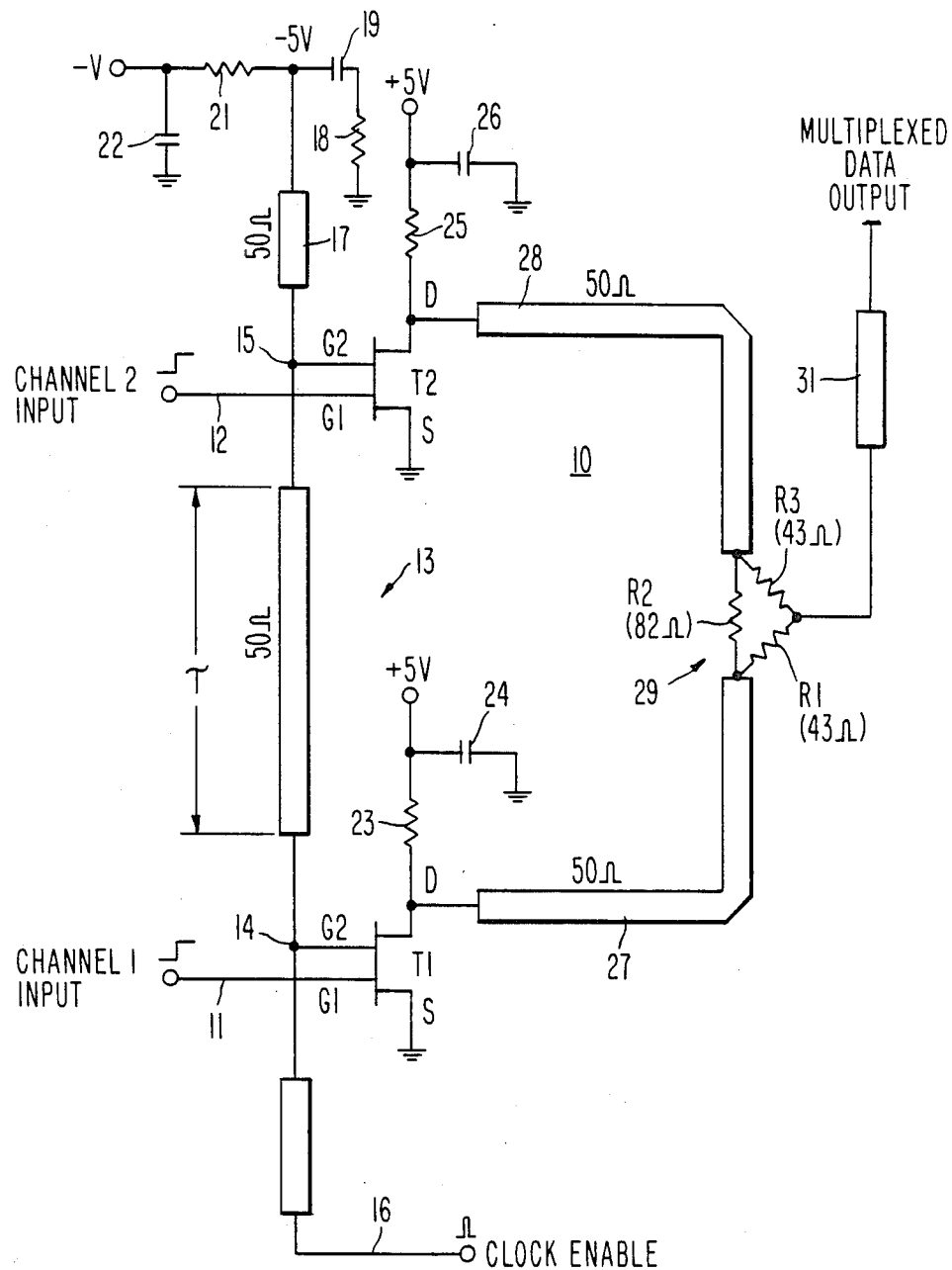
FIG. 1 is a schematic circuit diagram of the present invention multiplexer showing two input channels and an output line.

Refer now to FIG. 1 showing a schematic circuit diagram of the present invention distributed digital signal processor multiplexer 10. An input channel 11 is shown connected to the first gate G1 of a dual gate GaAs MESFET transistor T1 and a second input channel 12 is shown connected to the first gate G1 of the GaAs MESFET transistor T2. Transistors T1 and T2 are commercially available dual gate GaAs MESFET transistors of the type obtainable from such vendors as Plussey, Ltd. and Van Tech, etc. The tap distributed transmission line 13 is shown having a tap 14 connected to the second gate G2 of transistor T1 and tap 15 connected to the second gate G2 of transistor T2. The portion of the delay line shown between taps 14 and 15 has a delay shown by the symbol $\tau$.

It will be understood that for purposes of simplification, only transistors T1 and T2 are shown in FIG. 1. However, additional lengths of the delay line 13 may be added and the circuit itself will be repeated as will be explained hereinafter for a large number of transistors. A clock signal is applied to one end of the transmission line 13 at clock line 16. The other end of the transmission line 13 is terminated with a matching impedance network shown as coaxial cable 17, resistor 18 and capacitor 19. The termination network is shown connected to a voltage supply comprising a bias voltage $-V$ connected in series with a resistor 21 and in parallel with a capacitor 22. The purpose of the bias volgage $-V$ is to provide a cutoff voltage so that transistors T1 and T2 are in the normally OFF state. The purpose of the termination network 17-19 is to prevent clock pulses from reflecting back on to the transmission line 13.

The drain of transistor T1 is shown connected to a load and matching impedance resistor 23 in series with the drain source voltage shown as +5V. The bypass capacitor 24 prevents signals appearing at the drain of transistor T1 from appearing at the drain source voltage by conducting them to ground. In similar manner, the transistor T2 is provided with a load and matching impedance resistor 25, bypass capacitor 26 and drain source voltage.

Transmission line 27 is shown connected to the drain and output of transistor T1. Similarly, transmission line 28, which is identical in impedance and length to transmission line 27, is shown connected to the drain and output of transistor T2. Preferably, transmission lines 27 and 28, etc. are constructed as foil microstrip transmission lines to provide exact matching of line lengths and impedance. Compensated transmission lines 27 and 28 are connected to a balanced combining network 29 which, in turn, is connected to the output delta transmission line 31. Combining network 29 comprises resistors R1, R2 and R3 as an isosceles triangle to provide matched impedence termination for lines 27, 28 and 31.

As previously explained, the transistors T1 and T2 are in the normally OFF condition so that the voltage at the drain is close to +5V. In order to turn transistors T1 and T2 ON, it is only necessary to simultaneously apply a clock pulse from line 16 with a high state data pulse on lines 11 and 12. The input channel data high state is approximately zero volts and the low state is −5V. Similarly, the high state of the clock is at zero volts and the low state is −5V. When these two pulses occur at tap 14 and input line 11, transistor T1 turns ON and the voltage at the drain drops to approximately zero volts. The clock pulse being applied on line 16 propagates down the transmission line 13 and after a time period shown as $\tau$ appears at the tap 15 and gate G2 of transistor T2. When a high pulse or voltage condition of the clock is present at gate G2 and simultaneously a high data input is present at channel 2 at line 12, transistor T2 turns ON causing the voltage at the drain to change from its normally OFF state of approximately −5V to approximately zero volts. The output pulses at transistors T1 and T2 on transmission lines 27 and 28 are independent of each other and can appear as a continuous train of pulses or can appear as the absence of pulses. The pulse trains on transmission lines 27 and 28 are combined in the combining network 29 which appears to the transmission lines as a matched 50 ohm impedence. The combining network 29 further appears to the output transmission line 31 as a matched 50 ohm impedence. Thus, pulses appearing at the combining network 29 do not cause reflections which would reflect back on transmission lines 27, 28 or cause ringing on the output transmission line 31.

Having explained the operation of two transistors T1 and T2 tapped on to a transmission line 13, it will be understood that additional transistors up to as many as eight transistors may be tapped on to an extended transmission line 13 having more taps for purposes of this invention. The width of the clock pulses on line 16 defines the practical limit of the number of transistors which may be multiplexed on to a single output combining network like network 29.

Figure 2:
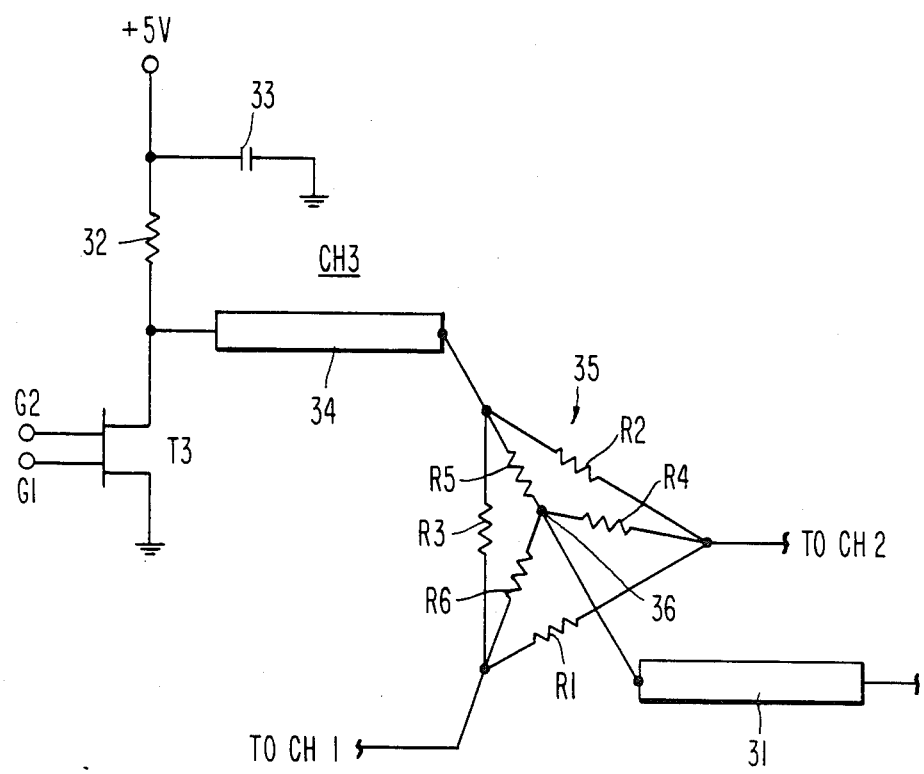
FIG. 2 is a schematic circuit diagram of the combining network for a three channel input which is employed with a multiplexer of the type shown in FIG. 1.

Refer now to FIG. 2 showing a transistor T3 having dual gates G1 and G2 adapted to be connected respectively to a third input channel and a tap on the transmission line 13. The drain of transistor T3 is shown connected to a load and matching resistor 32 which is connected to the drain supply voltage shown as +5V. The drain supply voltage is protected from pulses occurring at the drain by bypass capacitor 33 shown connected to ground. A transmission line 34 of the same length as transmission lines 27 and 28 is shown connected to a novel combining network 35 comprising a plurality of resistors R1 to R6 shown as a Y or star inside of a delta or triangle. The center of the combining network 35 is shown as a node 36 which is connected to an output transmission line 31 as described hereinbefore. Having explained the operation of transistors T1 and T2 connected respectively to input channels 1 and 2 at gates G1, it will be understood that another channel 3 (not shown) is capable of operating transistor T3 and producing pulses on transmission line 34 which are combined in combining network 35 and will appear on output transmission line 31. Similarly, as many as eight input channels and eight switching transistors may be combined on to the novel distributed digital signal process multiplexer comprising a distributed transmission line 13.

Refer now to FIGS. 3A to 3E showing how the pulses applied to the input channels 1 and 2 of FIG. 1 are combined with the clock pulses on line 16 to provide a train of data output pulses on line 31 which are effectively multiplexed to provide higher frequency rates than are capable of being applied at the input channels 11 and 12.

FIG. 3A shows a data pulse train 37 of the type which would be applied to channel 1. Employing GaAs MESFET transistors, the input swing of the data pulses being applied to the first gate G1 are preferably in a range of −5V to zero volts between the low and high states. The input data rate is shown as comprising one data pulse time $T_D$. Similarly, the pulse train 38 being applied to the second channel is shown as FIG. 3B which also swings between zero and −5V. The train of clock pulses being applied to input line 16 are shown having a pulse width $T_C$ which is much smaller than the width of the data pulses shown by pulse trains 37 and 38. When the pulse train 37 appearing on input channel 1 at line 11 occurs simultaneously at transistor T1 with the pulse train 39 occurring on clock line 16, a train of pulses are produced at the transmission line 27 which are combined in the combining network 29 and appear on output transmission line 31 as pulses 41 to 44 shown in FIG. 3E. The clock pulses at transistor T1 are delayed by time $\tau$ when they reach transistor T2 as shown in FIG. 3D. When data input pulses shown in FIG. 3B as pulse train 38 appears simultaneously with the delayed clock pulses now appearing at tap 15 and shown as pulse train 45 in FIG. 3D, there are produced output pulses on transmission line 28 which also occur at the combining network 29 and on output transmission line 31 as pulses 46 to 49 as shown in FIG. 3E.

Having explained the operation of a combining network for two and three input channels, it will be understood that this number of channels can be multiplied by a factor of two or three to achieve as many channels multiplexed together as can be clearly distinguished by the separation of clock pulses $T_C$ within one data pulse time $T_D$.

Having explained a preferred embodiment of the present invention and modification of the output transmission lines and combining networks to accommodate more than two output lines to a combining network, it will be understood that those skilled in the art may employ the novel ultra high frequency multiplexer to generate phase signals and/or multiplexed data so that it may be applied to microwave transmission devices in a frequency range much higher than was heretofore possible employing commercially available state-of-the-art integrated circuits. The invention described hereinbefore is capable of combining up to eight ECL integrated circuit data channels operating at rates of 300 megahertz. The dual gate GaAs MESFET transistors are operable at rates in excess of 5 gigahertz, thus, are capable of sensing data and clock pulses in this frequency range. The same structure may be employed with future high speed semiconductors and is not limited to this presently feasible range.

We claim:

1. A digital signal processor multiplexer for ultra high frequencies, comprising:

a plurality of GaAs field effect transistors each having a first and second gate input and a drain output, a biasing network coupled to the drain of each of said transistors and providing a termination network, a distributed transmission line having a delay line portion, delay taps connected to said delay line portion and to the second gate of each of said GaAs transistors, each said delay line tap being spaced apart from another delay tap by a desired time data rate period $1/\tau$, an ultra high frequency clock pulse source coupled to one end of said transmission line, a termination network coupled to the other end of said transmission line, data input channels each being coupled to one of said first gates of said GaAs transistors so that the presence of an input data pulse at an input channel simultaneously with a clock pulse on said data transmission line at the second gate of said transistors produces an output data pulse having the width of said clock pulses at the drain of said GaAs transistors, output transmission lines each coupled at one of its ends to the drain of one of said GaAs transistors, a combining network coupled to the other end of each of said output transmission lines providing a matched termination network, and a data output line coupled to said combining network for providing an output data rate which is a multiple of the rate of said input data pulses.

2. A digital signal processor multiplexer as set forth in claim 1 wherein said output transmission lines are matched in impedance.

3. A digital signal processor multiplexer as set forth in claim 1 wherein said output transmission lines are matched in time delay length.

4. A digital signal processor multiplexer as set forth in claim 3 wherein said output transmission lines are microstrip lines comprising a foil conductor.

5. A digital signal processor multiplexer as set forth in claim 1 wherein said plurality of GaAs transistors are greater than two in number.

6. A digital signal processor multiplexer as set forth in claim 1 wherein the pulse width of the time data rate pulses $T_D$ is at least four times greater than the width of the clock pulses $T_C$.

7. A digital signal processor multiplexer as set forth in claim 6 wherein the width of the time data rate pulses $T_D$ plus the width of the clock pulses $T_C$ is less than the width of the input data pulses.

8. A digital signal processor multiplexer as set forth in claim 1 wherein said combining network comprises a plurality of interconnected resistors.

9. A digital signal processor multiplexer as set forth in claim 1 wherein said combining network comprises three resistors connected in an isosceles triangle arrangement.

10. A digital signal processor multiplexer as set forth in claim 9 wherein said combining network further includes a star network of resistors comprising pairs of resistors connected in parallel across said three resistors and having a common node output.

* * * * *